United States Patent [19]

Heller et al.

[11] 4,186,002
[45] Jan. 29, 1980

[54] PHOTOCHROMIC COMPOUNDS FOR HOLOGRAM RECORDING

[76] Inventors: Harold G. Heller, 11 Erwgoch, Waunfawr, Aberystwyth, Dyfed SY23 3AZ, Wales; Peter Waterworth, 8 Greenway, Eastcote, Towcester, Northants; Rodney J. Hurditch, 8 Hadrian Gate, Brackley, Northants, both of England

[21] Appl. No.: 955,342

[22] Filed: Oct. 27, 1978

[30] Foreign Application Priority Data

Oct. 28, 1977 [GB] United Kingdom ............... 45011/77

[51] Int. Cl.² .................... G03C 5/04; G03C 1/52
[52] U.S. Cl. ...................... 430/1; 427/53.1; 350/3.62
[58] Field of Search ............. 96/27 H, 90 PC; 350/3.62; 427/53

[56] References Cited

U.S. PATENT DOCUMENTS

| 3,556,631 | 1/1971 | Cook | 350/3.5 |
| 3,642,472 | 2/1972 | Mayo | 96/27 H |
| 3,723,121 | 3/1973 | Hauser | 96/27 H |
| 3,989,530 | 11/1976 | Robillard | 96/27 H |
| 3,996,052 | 12/1976 | Schlesinger | 427/53 X |
| 3,997,350 | 12/1976 | Ikeo et al. | 96/90 PC X |

*Primary Examiner*—Edward C. Kimlin
*Attorney, Agent, or Firm*—Fleit & Jacobson

[57] ABSTRACT

A holographic recording method and device is disclosed in which the recording medium is a photochromic material in which a holographic record is recorded by bleaching the photochromic material using a laser beam. The photochromic materials are a class of fulgides and fulgimides.

11 Claims, 1 Drawing Figure

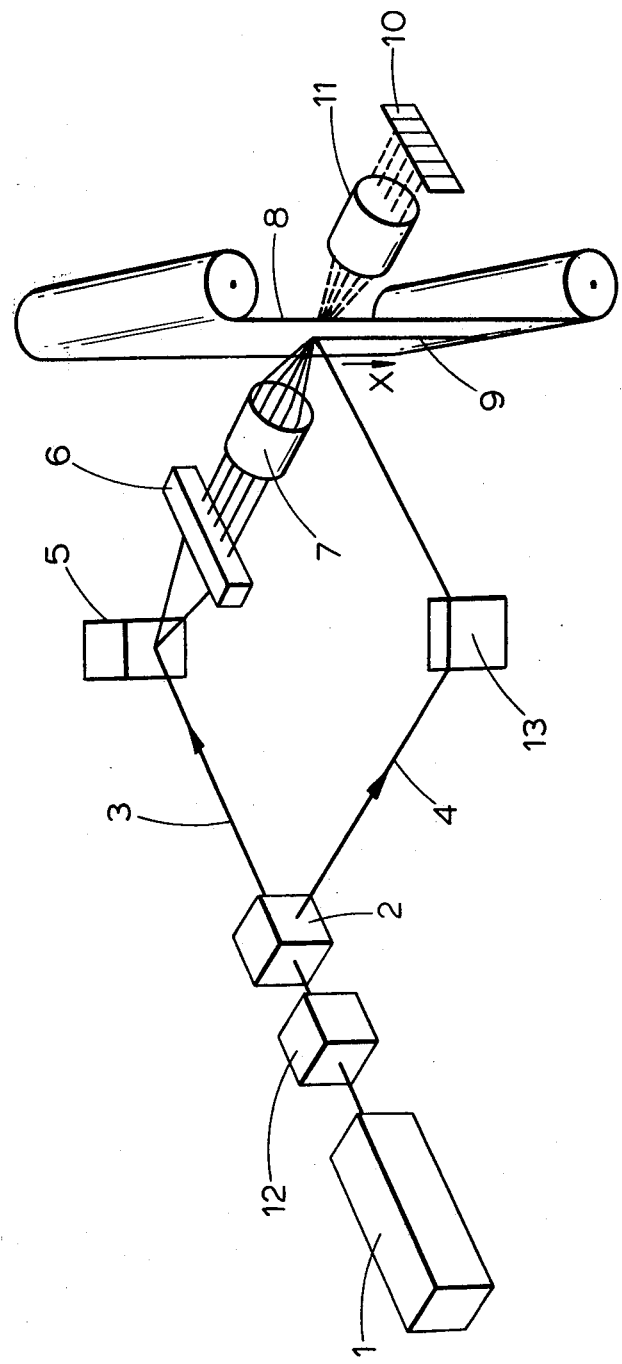

PHOTOCHROMIC COMPOUNDS FOR HOLOGRAM RECORDING

FIELD OF THE INVENTION

This invention relates to holographic data recording and storage and in particular provides a method of recording and storing data on a photochromic recording surface by holography.

BACKGROUND TO THE INVENTION

Optical data storage system have attractions as an alternative to those based on magnetic tapes and discs, principally because of their higher storage density, which in theory is only limited by the optical diffraction limit of light waves, and their potentially higher data input rates.

Holographic recording techniques have been proposed for archival storage of data using silver halide photographic films as the recording media but such systems are inherently non-reversible so that the recorded information cannot be altered and is therefore not suitable for the great bulk of data storage applications. Also even in the case of very high resolution photographic films, the grain size of the silver halide particle placed a serious limited on the storage capacity of the film.

While photochromic compounds might be regarded as possible substitutes for a silver halide emulsion, as a data recording media, such compounds are generally found to be unsuitable for a variety of reasons. For example, known photochromic compounds generally exhibit poor thermal stability and undergo non-reversible side reactions on photoactivation so that their sensitivity quickly diminishes over a few cycles.

The present invention utilises the unusual properties of a series of photochromic succinic anhydride and succinimide derivatives having the following general formula:

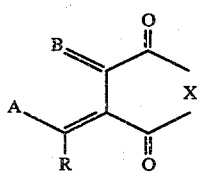

(I)

wherein x represents oxygen or >NR$_6$, R$_6$ being hydrogen or an alkyl, aryl or aralkyl group;

R represents an alkyl, aryl, aralkyl or heterocyclic group;

A represents a 3-furyl, 3-thienyl, 3-benzofuryl or 3-benzothienyl group;

B represents an adamantylidene group or the grouping

in which R$_2$ and R$_3$ independently represent an alkyl, aryl, aralkyl or heterocyclic group or one of R$_2$ and R$_3$ represents hydrogen and the other represents an alkyl, aryl, aralkyl or heterocyclic group.

Compounds of the general formula (1) above undergo photocyclisation when exposed to light in the ultra-violet range, ring closure occurring between the carbon atom to which the groups R$_2$ and R$_3$ are attached and the 2-position of the furyl or thienyl ring. The photocyclisation reaction is illustrated by the following typical case:

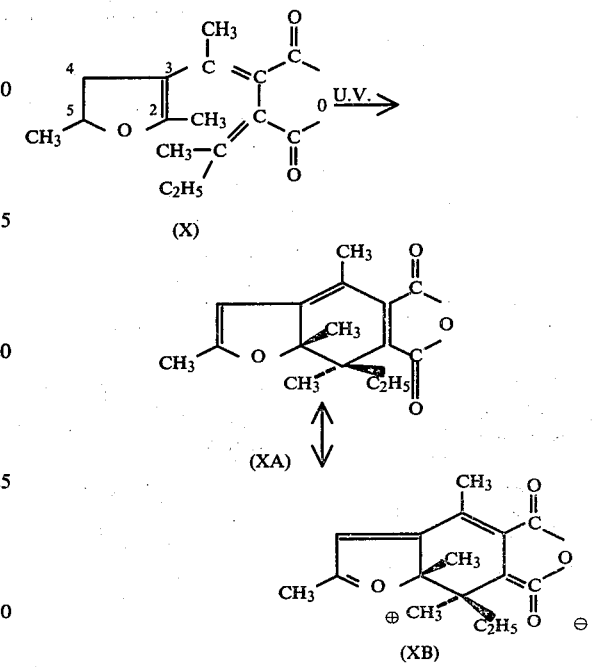

Under the influence of U.V. light the compound (X) is converted in high yield to the cyclic form which is stabilised as shown in forms (XA) and (XB).

The cyclic forms of the compounds of general formula (1) are deeply coloured, usually exhibiting a visual effect in the bright red to deep purple range, and this is believed to arise from the double bond structure extending from the oxygen or sulphur heteroatom at one end to the succinic anhydride carbonyl oxygen at the other.

In addition to possessing good thermal stability and low fatigue (relative freedom from irreversible photochemical side reactions) the compounds of formula (I) exhibit a high rate of conversion to the coloured form which is deeply coloured. The last mentioned properties are very important in an optical recording medium since it must be recognised that there is no "gain" when a photochromic compound is exposed to light of the appropriate wavelength. One activating photon can only convert one molecule of photochromic compound to its coloured form whereas one photon will in photographic emulsion cause an entire grain of silver halide to be reduced to silver after development. Thus, it will be appreciated that the high sensitivity and deeply coloured forms of the photochromic compounds are of considerable significance in their use as optical recording media.

The compounds of Formula (I) above are disclosed in U.S. patent application Ser. No. 846,148 (Harold G. Heller), and the disclosure of that application is incorporated herein by reference.

According to one aspect of the present invention there is provided a holographic data recording and storage method which comprises subjecting a photochromic recording material to radiation whereby the material is converted to its coloured form and forming a holographic record using coherent visible light by interfering a reference beam and a data beam in the plane of the surface of the material whereby a series of holograms embodying data recorded from said data beam are formed by bleaching said material, said photochromic material comprising a substrate having coated thereon or dispersed therein a photochromic compound of the general formula:

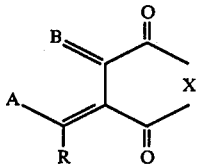
(I)

wherein
- x represents oxygen or >NR$_6$, R$_6$ being hydrogen or an alkyl, aryl, or aralkyl group;
- R represents an alkyl, aryl, aralkyl or heterocyclic group;
- A represents a 3-furyl, 3-thienyl, 3-benzofuryl or 3-benzothienyl group;
- B represents an adamantylidene group or the grouping

in which R$_2$ and R$_3$ independently group or one of R$_2$ and R$_3$ represents hydrogen and the other represents an alkyl, aryl, aralkyl or heterocyclic group.

U.S. patent application Ser. No. 846,148 describes a sub-class of compounds falling within the above general formula (I) above in which B represents an adamantylidene group. This sub-class of compounds possess a structure which is very stable and free from both angle and conformational strain and in which bond migration does not occur. It has been found that compounds of this sub-class are particularly useful for holographic recording purposes.

According to a further aspect of the present invention there is provided a holographic data recording and storage method which comprises producing a holographic record using coherent visible light by interfering a reference beam and a data beam in the plane of the surface of the material, whereby a series of holograms embodying data recorded from said data beam are formed, said photochromic material comprising a substrate having coated thereon or dispersed therein a photochromic compound of the general formula:

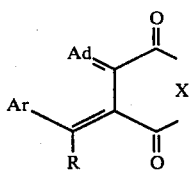
(II)

wherein
- X represents oxygen or >NR$_6$, R$_6$ being hydrogen or an alkyl, aryl, or aralkyl group;
- R represents hydrogen or an alkyl, aryl, aralkyl or heterocyclic group;
- Ar represents a 3-furyl, 3-thienyl group, 3-benzofuryl or 3-benzothienyl group, or a phenyl group containing a meta alkoxy or aryloxy substituent; and
- Ad represents an adamantylidene group.

Preferably R in formula (I) and (II) above represents a lower alkyl (e.g. having 1 to 6 carbon atoms), a phenyl, napthyl or alkylphenyl group.

Formation of the hologram by bleaching (i.e. by conversion of the photochromic compound from its cyclic to non-cyclic form) is of great practical significance since it enables the powerful emission lines of the argon ion laser at 488 or 514 mm to be used for writing the data. The term bleaching is used to describe this conversion, although in some cases the photochromic compound may have a pale colour in its non-cyclic form.

Conversion of the compound to its coloured state may be achieved by off line exposure to a U.V., e.g. mercury vapour lamp or, in the case where an argon ion laser is used, by operating the laser simultaneously in the visible and U.V. ranges and directing the U.V. beam onto the photochromic surface so as to activate the surface prior to writing the data by bleaching.

The invention includes a holographic data recording and storage method which comprises a holographic record using coherent visible light by interfering a reference beam and a data beam in the plane of the surface of the material whereby a series of holograms embodying data recorded from said data beam are formed, said photochromic material comprising a substrate having coated thereon or dispersed therein a photochromic compound of the general formula:

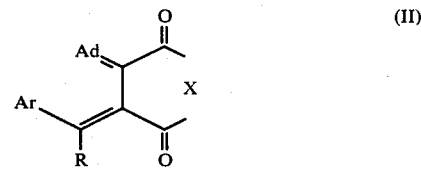
(II)

wherein
- X represents oxygen or >NR$_6$, R$_6$ being hydrogen or an alkyl, aryl, or aralkyl group;
- R represents hydrogen or an alkyl, aryl, aralkyl or heterocyclic group;
- Ar represents a 3-furyl, 3-thienyl group, 3-benzofuryl or 3-benzothienyl group, or a phenyl group containing a meta alkoxy or aryloxy substituent; and
- Ad represents an adamantylidene group.

Apparatus for holographic data storage in accordance with the invention is illustrated by the accompanying diagrammatic drawing.

Referring to the drawing, a water-cooled argon ion laser 1 is operated to produce a beam of 488 nm or 515 nm wavelength at an output of about 2 watts. The output beam is divided by a beam splitter 2 into a beam 3 (termed the data beam) and a beam 4 (termed the reference or replay beam). Beam 3 is directed by a further beam splitter 5 onto a page composer 6 of conventional construction. The page composer is an array of light operated shutters and preferably is of the PLZT type i.e. an array of lanthanum doped lead zirconate titanate electrodes bonded to a block of glass. Lens 7 focusses the beam onto the photochromic surface which, as in the illustrated embodiment, is a film 8 coated with a photochromic compound in a manner described below. Beam 4 is directed onto the film by a mirror 13. A hologram 9 is formed on the surface of the film by interference of the data beam with the reference beam.

The film 8 is transported through the apparatus by means not shown in the direction of the arrow X. As indicated above, data is preferably written on the film by bleaching the coloured form of the photographic compound. While the film can be treated off line with U.V. light to convert it to its coloured form, it is usually preferable to simultaneously operate the laser 1 in the visible and U.V. range and provide a suitable optical path to direct a U.V. beam onto the film so that selected data or blocks of data can be erased and/or rewritten.

In operation, the page composer 6 is controlled by electrical input signals which correspond with the data to be recorded. Thus a pattern of light beams is produced by the composer each of which carries the encoded data applied electrically to the page composer. These beams when focussed onto the film 9 interfere with the reference beam 4 to produce a hologram track which can be read out as described below. A higher data recording density can be achieved by a known technique called multiplexing in which a series of overlapping sub-hologram tracks are formed. This is achieved by deflecting the data and reference beams transversely of the film using scanning means such as mirrors rotated by a stepping motor.

Read out of the hologram is effected by switching off the data beam and using the reference beam to illuminate the hologram and focussing the image on a photodiode array 10 via a lens 11. Surprisingly, read out of the hologram can be achieved using light of the same wavelength as that used for recording without substantial loss of the recorded image. However, the level of destructive read out can be reduced to an insignificant level by reading out the holograms at a wavelength outside the visible absorption band of the photochromic compound, for example in the case of photochromic compounds of general formula (I) at a wavelength of 632 nm using a neon ion laser. Usually it is more convenient to read out at the same wavelength as recording but at a lower intensity.

It will be appreciated that the recording and retrieving of data can be carried out simultaneously or at different times.

The accompanying drawing also shows a clock modulator 12 which enables correct synchronism of the recorded data and its correct retrieval.

The preparation of the Photochromic compounds themselves is described in U.S. patent application Ser. No. 846,148. The compounds selected for the purposes of the present invention must have a group other than hydrogen at the position R in the formula (I); otherwise the photochromic properties are not sufficiently pronounced.

Preferably, the photochromic compounds are coated onto or incorporated within a light-transmissive support using a suitable binder. One convenient method is to dissolve the photochromic compound in a common solvent for the binder and the compound and coat the solution onto a suitable support using conventional coating procedures, followed by drying to remove the solvent. It has been found that best results are achieved using non-halogenated solvents and plastics binders which have a low permeability towards oxygen, e.g. polyesters and polycarbonates. The support can be in any desired form, e.g. as tapes, discs, plates or screens.

The following Examples will illustrate the preparation of a coated film in accordance with the invention.

EXAMPLE 1

10 Grams of 2,5-dimethyl-3-furylethylidene (isopropylidene) succinic anhydride were dissolved, together with 100 grams of cellulose acetate, in 1 liter of a 50/50 volume mixture of 2-hydroxy ethyl acetate and acetone. The resulting solution was filtered and coated onto a polyester base sheet using a blade over roller coating technique to achieve a wet coating thickness of 120 microns. After drying at 120° C., the coating had a dry thickness of about 12 microns. The resulting sheet produced a deep blue/purple image when exposed to U.V. light having a wavelength of 366 nm, the image being bleached by subsequent exposure to a light beam at 550 nm and can be used as a holographic recording material. Screens of higher optical quality can be produced using glass plates in place of polyester film.

EXAMPLE 2

2,5-dimethyl-3-thienyl ethylidene-isopropylidene succinic anhydride (50 mg) was dissolved in 5 grams of a polyester glass by heating to 100° C. and stirring continuously. The molten solution was then sandwiched between 2½"×2" glass plates which were separated by 20 m spacers. The whole was evacuated to remove trapped air bubbles and allowed to cool to form a solid film. A deep red image could be produced by impinging a beam of U.V. light on the film, which was bleached with an argon ion laser beam at 550 nm. The film had a higher optical quality than that produced in Example 1 and can be used for holographic recording medium.

We claim:

1. A holographic data recording and storage method which comprises subjecting a photochromic recording material to radiation whereby the material is converted to its coloured form and forming a holographic record using coherent visible light by interfering a reference beam and a data beam in the plane of the surface of the material whereby a series of holograms embodying data recorded from said data beam are formed by bleaching said material, said photochromic material comprising a substrate having coated thereon or dispersed therein a photochromic compound of the general formula:

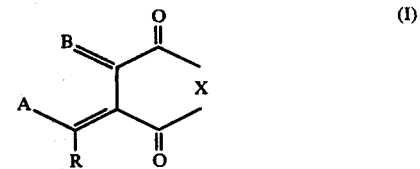

(I)

wherein
x represents oxygen or >NR$_6$, R$_6$ being hydrogen or an alkyl, aryl or aralkyl group;
R represents an alkyl, aryl, aralkyl or heterocyclic group;
A represents a 3-furyl, 3-thienyl, 3-benzofuryl or 3-benzothienyl group;
B represents an adamantylidene group or the grouping

in which R$_2$ and R$_3$ independently represent an alkyl, aryl, aralkyl or heterocyclic group or one of $R_2$ and $R_3$ represents hydrogen and the other represents an alkyl, aryl, aralkyl or heterocyclic group.

2. A method according to claim 1 in which R in formula (I) represents a lower alkyl group, a phenyl, naphthyl or alkylphenyl group.

3. A method according to claim 1 in which the group represented by A in formula (I) is a group of the formula:

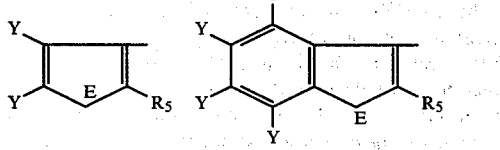

wherein
E represents oxygen or sulphur;
each Y is independently selected from hydrogen, halogen, alkyl, aryl, aralkyl, alkoxy and aryloxy groups;
$R_5$ represents hydrogen or an alkyl, aryl or aralkyl group.

4. A method according to claim 1 in which the photochromic material is supported on a film or disc which is moved relatively to the data and reference beams.

5. A method according to claim 4 in which the hologram track is formed in a pattern of overlapping sub-holograms, thus increasing the packing density of the surface.

6. A method according to claim 1 in which the photochromic compound is converted to its coloured form as a preliminary step separate from the holographic recording.

7. A method according to claim 1 in which the photochromic compound is converted to its coloured form using U.V. light generated by a laser.

8. A method according to claim 1 in which the hologram is recorded using visible light emitted from an argon ion laser of a wavelength in the range of 514 to 550 nm.

9. A method according to claim 8 in which the same laser is used to generate the U.V. light for conversion of the photochromic compound to its coloured form and the visible light for recording the hologram by bleaching.

10. A holographic data recording and storage method which comprises producing a holographic record using coherent visible light by interfering a reference beam and data beam in the plane of the surface of the material whereby a series of holograms embodying data recorded from said data beam are formed, said photochromic material comprising a substrate coated thereon or dispersed therein a photochromic compound of the general formula:

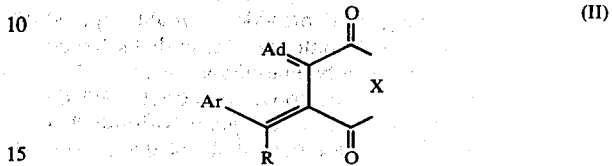

wherein
X represents oxygen or >$NR_6$, $R_6$ being hydrogen or an alkyl, aryl or aralkyl group;
R represents hydrogen or an alkyl, aryl, aralkyl or heterocyclic group;
Ar represents a 3-furyl, 3-thienyl group, 3-benzofuryl or 3-benzothienyl group, or a phenyl group containing a meta alkoxy or aryloxy substituent; and
Ad represents an adamantylidene group.

11. A holographic data recording and storage device which comprises a disc or film having a coating containing a photochromic compound thereon or therein, means for moving or transporting said disc or film, a laser capable of emitting radiation of a wavelength which will bleach the photochromic compound, an optical system, including a page composer, arranged to produce a reference beam and a data beam and to focus said beams on the disc or film to produce a hologram or series of holograms, said photochromic compound comprising a compound of the general formula (I).

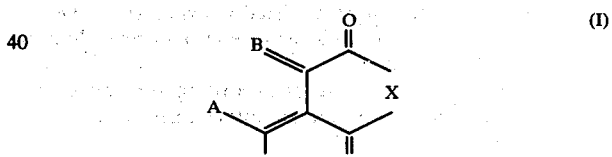

wherein A, R, B and X have the same significance as set forth in claim 1.

* * * * *